(12) United States Patent  (10) Patent No.: US 7,741,912 B1
Nadimpalli  (45) Date of Patent: Jun. 22, 2010

(54) VARYING AMPLIFIER BIAS PARAMETERS TO MEET RADIO FREQUENCY (RF) COMMUNICATIONS REQUIREMENTS

(75) Inventor: Praveen V. Nadimpalli, Chandler, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 12/358,611

(22) Filed: Jan. 23, 2009

(51) Int. Cl.
*H03G 3/10* (2006.01)
(52) U.S. Cl. .................. 330/285; 330/302; 330/305
(58) Field of Classification Search .............. 330/285, 330/302, 305
See application file for complete search history.

(56) References Cited

U.S. PATENT DOCUMENTS

| | | | |
|---|---|---|---|
| 6,359,516 B1 * | 3/2002 | Luo et al. | 330/296 |
| 6,624,700 B2 * | 9/2003 | Luo et al. | 330/281 |
| 6,794,935 B2 * | 9/2004 | Klomsdorf et al. | 330/129 |
| 6,937,101 B2 * | 8/2005 | Hageman et al. | 330/285 |
| 7,439,806 B2 * | 10/2008 | Dow | 330/285 |

* cited by examiner

*Primary Examiner*—Patricia Nguyen
(74) *Attorney, Agent, or Firm*—Withrow & Terranova, P.L.L.C.

(57) ABSTRACT

The present invention relates to amplifier bias circuitry, which provides a direct current (DC) bias to a radio frequency (RF) amplifier. The amplifier bias circuitry includes a control loop having a control loop bandwidth, and an output impedance associated with providing the DC bias to the RF amplifier. The amplifier bias circuitry may vary the DC bias, the output impedance, the control loop bandwidth, or any combination thereof, to meet wireless communications requirements. For example, in a multi-mode radio, low output impedance may be needed to meet linearity requirements of the RF amplifier associated with wireless communications protocols in one mode of the multi-modes; however, some low output impedance designs may reduce the control loop bandwidth below that needed to meet modulation requirements associated with wireless communications protocols in another mode of the multi-modes.

24 Claims, 13 Drawing Sheets

VARYING AMPLIFIER BIAS PARAMETERS TO MEET RADIO FREQUENCY (RF) COMMUNICATIONS REQUIREMENTS

FIELD OF THE INVENTION

Embodiments of the present invention relate to direct current (DC) bias of radio frequency (RF) amplifiers, which may be used in RF communications systems.

BACKGROUND OF THE INVENTION

As portable wireless devices, such as cell phones, wireless personal digital assistants (PDAs), or the like, become increasingly ubiquitous, wireless communications protocols are continually evolving to expand supported feature sets. To maximize compatibility with as many different wireless communications systems as possible, modern portable wireless devices may be multi-mode devices, which are able to operate in one of multiple modes associated with different RF communications bands, different wireless communications protocols, or both.

Many portable wireless devices are capable of transmitting RF signals and include an RF transmitter, which has at least one RF amplifier, such as a power amplifier. To function properly, the RF amplifier may need a DC bias, which may be provided by amplifier bias circuitry. Characteristics associated with providing the DC bias may include a value of the DC bias, an output impedance associated with providing the DC bias to the RF amplifier, and a control loop bandwidth associated with a control loop. When switching between RF communications bands, between different wireless communications protocols, or both, any or all of the value of the DC bias, the output impedance associated with providing the DC bias to the RF amplifier, and the control loop bandwidth may need to be changed. For example, a required value of the DC bias may be based on an output power level from the RF amplifier, the output impedance associated with providing the DC bias to the RF amplifier may be based on linearity requirements of the RF amplifier, and the control loop bandwidth may be based on a modulation scheme used by the RF amplifier. Specifically, some wireless communications protocols have strict linearity requirements, which may require a low output impedance associated with the DC bias. Some wireless communications protocols, such as those that include amplitude modulation (AM), may require a wide control loop bandwidth. Thus, there is a need for amplifier bias circuitry that can support multiple RF communications bands, different wireless communications protocols, or both, and can vary any or all of the value of the DC bias, the output impedance associated with providing the DC bias, and the control loop bandwidth.

SUMMARY OF THE EMBODIMENTS

The present invention relates to amplifier bias circuitry, which provides a DC bias to an RF amplifier. The amplifier bias circuitry includes a control loop having a control loop bandwidth, and an output impedance associated with providing the DC bias to the RF amplifier. The amplifier bias circuitry may vary the DC bias, the output impedance, the control loop bandwidth, or any combination thereof, to meet wireless communications requirements. For example, in a multi-mode radio, low output impedance may be needed to meet linearity requirements of the RF amplifier associated with wireless communications protocols in one mode of the multi-modes; however, some low output impedance designs may reduce the control loop bandwidth below that needed to meet modulation requirements associated with wireless communications protocols in another mode of the multi-modes. Therefore, any or all of the DC bias, the output impedance, and the control loop bandwidth may need to be varied to meet wireless communications requirements, particularly when switching between modes. In one embodiment of the present invention, the amplifier bias circuitry may select and operate in one of multiple operating modes. Selection of the operating mode may be associated with selection of an RF transmit band, of a wireless communications protocol, or both.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to amplifier bias circuitry, which provides a DC bias to an RF amplifier. The amplifier bias circuitry includes a control loop having a control loop bandwidth, and an output impedance associated with providing the DC bias to the RF amplifier. The amplifier bias circuitry may vary the DC bias, the output impedance, the control loop bandwidth, or any combination thereof, to meet wireless communications requirements. For example, in a multi-mode radio, low output impedance may be needed to meet linearity requirements of the RF amplifier associated with wireless communications protocols in one mode of the multi-modes; however, some low output impedance designs may reduce the control loop bandwidth below that needed to meet modulation requirements associated with wireless communications protocols in another mode of the multi-modes. Therefore, any or all of the DC bias, the output impedance, and the control loop bandwidth may need to be varied to meet wireless communications requirements, particularly when switching between modes. In one embodiment of the present invention, the amplifier bias circuitry may select and operate in one of multiple operating modes. Selection of the operating mode may be associated with selection of an RF transmit band, of a wireless communications protocol, or both.

Figure 1:
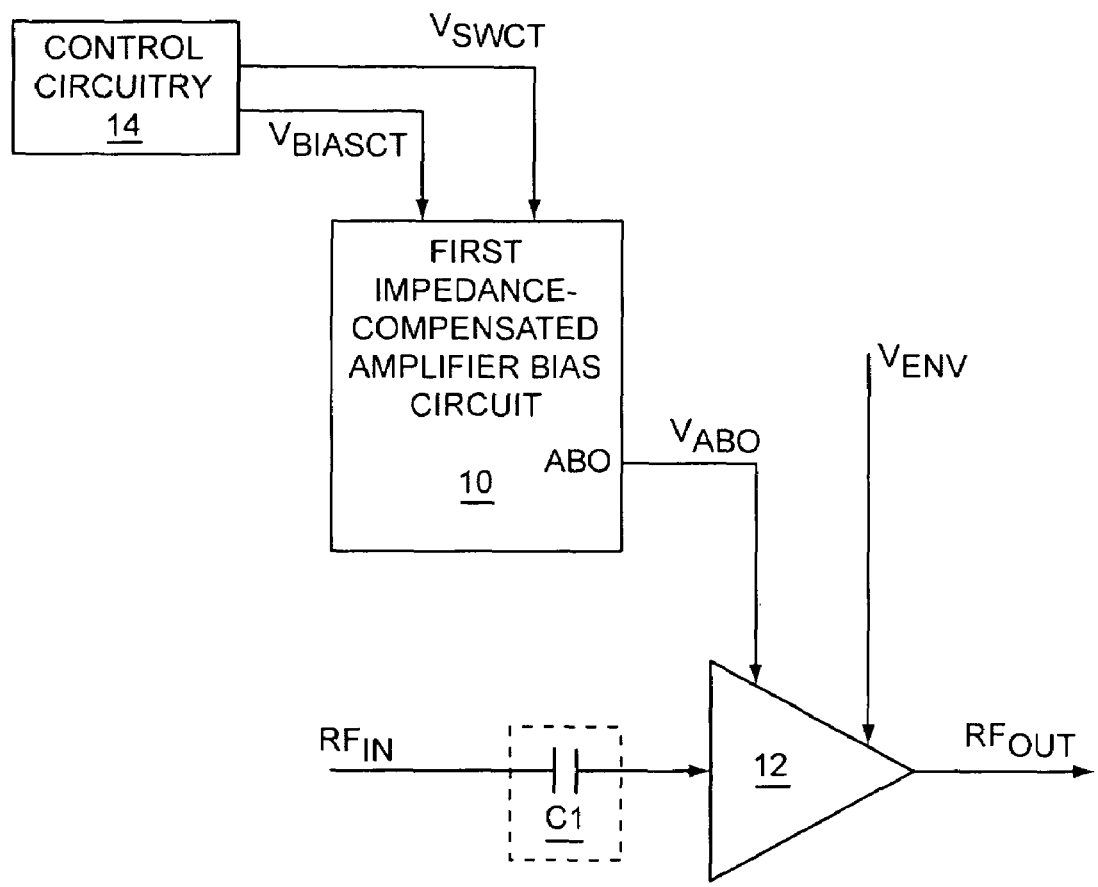
FIG. 1 shows a first impedance-compensated amplifier bias circuit according to one embodiment of the present invention.

FIG. 1 shows a first impedance-compensated amplifier bias circuit 10 according to one embodiment of the present invention. The first impedance-compensated amplifier bias circuit 10 provides an amplifier bias output signal $V_{ABO}$ to an amplifier 12, such as an RF power amplifier, from an amplifier bias output ABO. An RF input signal $RF_{IN}$ feeds the amplifier 12 through a first capacitive element C1, and the amplifier 12 amplifies the RF input signal $RF_{IN}$ to provide an RF output signal $RF_{OUT}$. The first capacitive element C1 alternating current (AC) couples the RF input signal $RF_{IN}$ to the amplifier 12. The amplifier bias output signal $V_{ABO}$ provides a DC bias to the amplifier 12 for proper operation. In one embodiment of the present invention, an envelope power supply (not shown) provides an envelope supply signal $V_{ENV}$ to the amplifier 12. The amplifier 12 and the first impedance-compensated amplifier bias circuit 10 may be used in a multi-mode radio, which may support two or more wireless communications protocols, which may transmit using two or more RF transmit bands.

In one embodiment of the present invention, control circuitry 14 may select either a first operating mode or a second operating mode. The first and the second operating modes may be associated with a first and a second RF transmit band, a first and a second wireless communications protocol, or both, respectively. The first impedance-compensated amplifier bias circuit 10 has a control loop, which has a control loop bandwidth. The amplifier bias output ABO of the first impedance-compensated amplifier bias circuit 10 has an output impedance, which may influence linearity of the amplifier 12. The DC bias provided for proper operation may depend upon which of the first operating mode or the second operating mode is selected. The control loop bandwidth provided for proper operation may depend upon which of the first operating mode or the second operating mode is selected. The output impedance presented to the amplifier bias output ABO may depend upon which of the first operating mode or the second operating mode is selected.

The control circuitry 14 provides a bias control signal $V_{BIASCT}$ to the first impedance-compensated amplifier bias circuit 10 to select the appropriate DC bias to the amplifier 12 depending on which of the first operating mode or the second operating mode is selected. The control circuitry 14 provides a switch control signal $V_{SWCT}$ to the first impedance-compensated amplifier bias circuit 10 to select the appropriate output impedance from the amplifier bias output ABO to the amplifier 12 depending on which of the first operating mode or the second operating mode is selected. The control loop bandwidth may depend on the DC bias, the output impedance from the amplifier bias output ABO to the amplifier 12, or both. Alternate embodiments of the present invention may involve selection of one of three or more operating modes, which may be associated with one of three or more values of output impedance from the amplifier bias output ABO, with one of three or more values of DC bias, with one of three or more values of control loop bandwidth, or any combination thereof.

Figure 2:
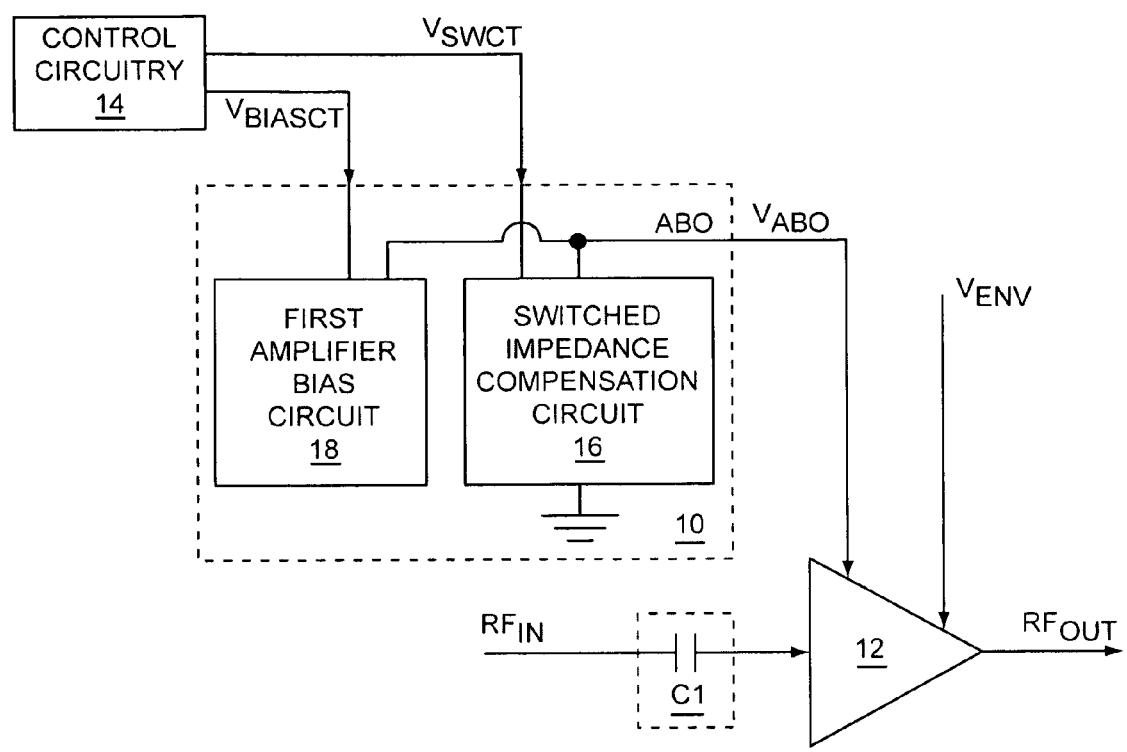
FIG. 2 shows details of the first impedance-compensated amplifier bias circuit illustrated in FIG. 1.

FIG. 2 shows details of the first impedance-compensated amplifier bias circuit 10 illustrated in FIG. 1. The first impedance-compensated amplifier bias circuit 10 includes a switched impedance compensation circuit 16 and a first amplifier bias circuit 18. The control circuitry 14 feeds the bias control signal $V_{BIASCT}$ to the first amplifier bias circuit 18 to select the appropriate DC bias to the amplifier 12 depending on which of the first operating mode or the second operating mode is selected. The control circuitry 14 feeds the switch control signal $V_{SWCT}$ to the switched impedance compensation circuit 16 to select the appropriate output impedance from the amplifier bias output ABO to the amplifier 12 depending on which of the first operating mode or the second operating mode is selected. The switched impedance compensation circuit 16 is coupled to ground. In another embodiment of the first impedance-compensated amplifier bias circuit 10, the switched impedance compensation circuit 16 is coupled to a DC reference.

Figure 3:
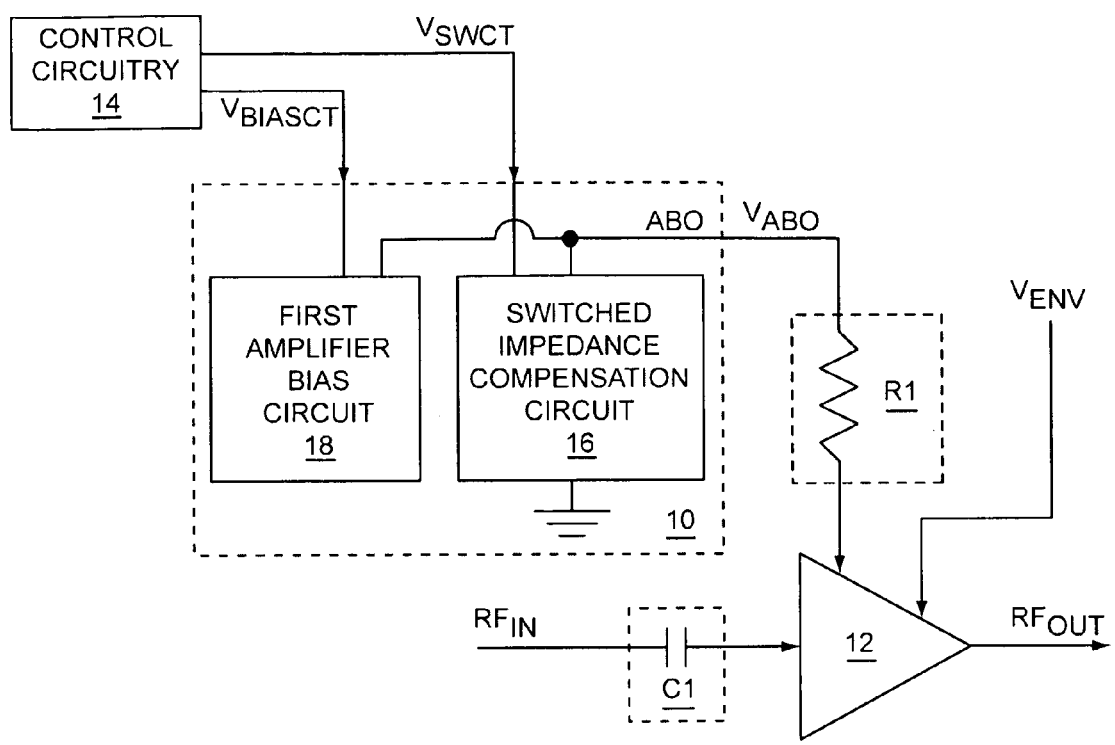
FIG. 3 shows a first resistive element external to an amplifier according to an alternate embodiment of the present invention.

FIG. 3 shows a first resistive element R1 external to the amplifier 12 according to an alternate embodiment of the present invention. The first resistive element R1 is coupled between the amplifier bias output ABO and a DC bias input (not shown) to the amplifier 12. Typically, the amplifier 12 has an amplifying transistor element with a control input, such as a base or gate. There may be a resistive element coupled between the amplifier bias output ABO and the control input of the amplifying transistor element. The resistive element may be internal to the amplifier 12, as illustrated in FIG. 2, or external to the amplifier 12, as illustrated in FIG. 3.

Figure 4:
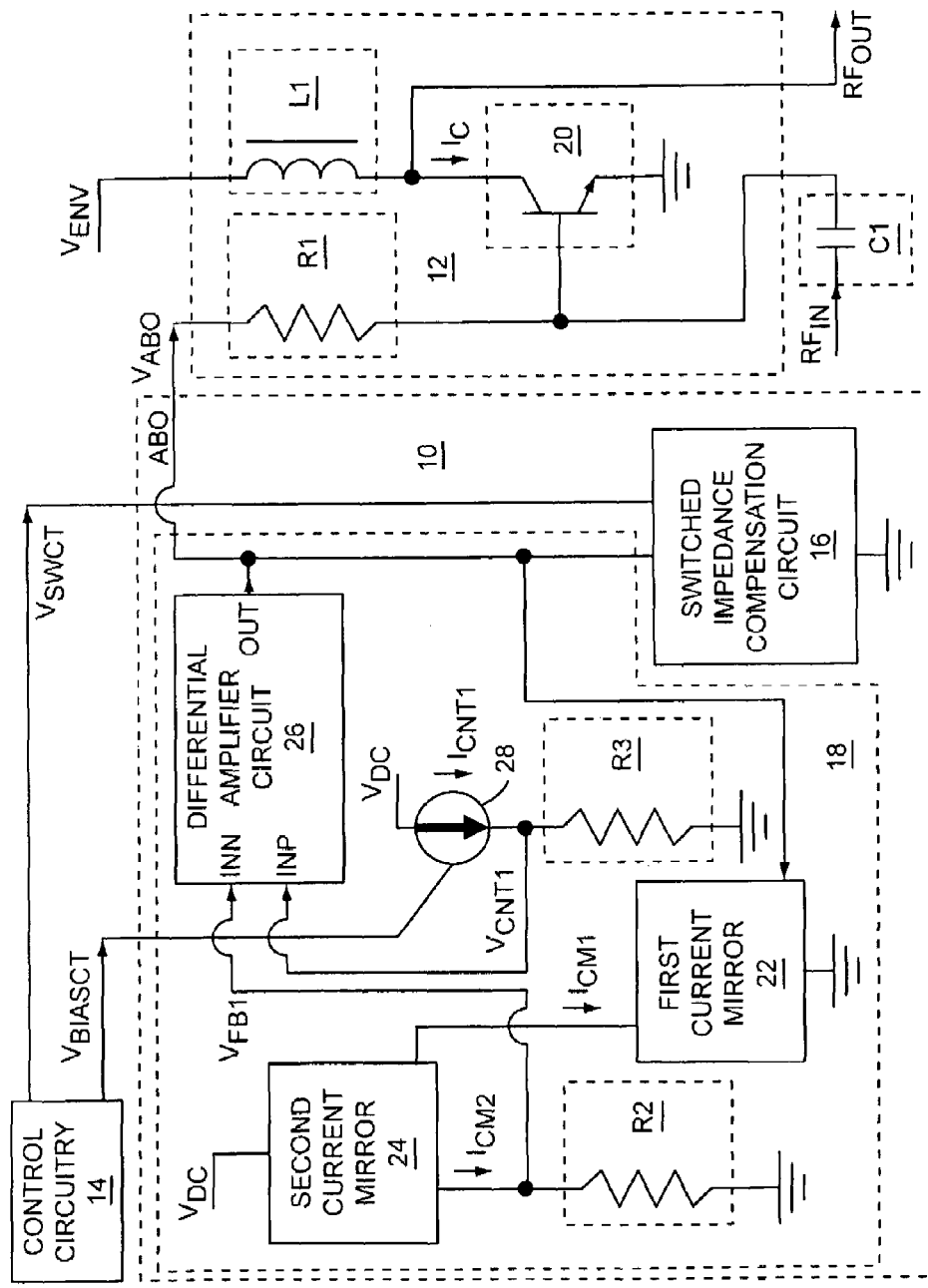
FIG. 4 shows details of a first amplifier bias circuit and an amplifier illustrated in FIG. 2.

FIG. 4 shows details of the first amplifier bias circuit 18 and the amplifier 12 illustrated in FIG. 2. The amplifier 12 includes an amplifier NPN transistor element 20, the first resistive element R1 coupled between the amplifier bias output ABO and a base of the amplifier NPN transistor element 20, and a first inductive element L1 coupled between an envelope power supply (not shown), which provides the envelope supply signal $V_{ENV}$, and a collector of the amplifier NPN transistor element 20. The RF input signal $RF_{IN}$ feeds the base of the amplifier NPN transistor element 20 through the first capacitive element C1, and the collector of the amplifier NPN transistor element 20 provides the RF output signal $RF_{OUT}$. A collector current $I_C$ flows through the collector of the amplifier NPN transistor element 20. An emitter of the amplifier NPN transistor element 20 is coupled to ground. In another embodiment of the amplifier 12, the amplifier NPN transistor element 20 is coupled to the DC reference. Alternate embodiments of the amplifier 12 may include any number of any type of transistor element, such as a PNP transistor element, a field effect transistor (FET) element, an N-type FET (N-FET) element, a P-type FET (P-FET) element, a metal-oxide-semiconductor (MOS) FET (MOSFET) element, an N-type MOSFET (N-MOSFET) element, a P-type MOSFET (P-MOSFET) element, or any combination thereof.

The first amplifier bias circuit 18 includes a first current mirror 22, a second current mirror 24, a differential amplifier circuit 26, a first current source 28, a second resistive element R2, and a third resistive element R3. The second current mirror 24 and the first current source 28 are coupled to a DC power supply (not shown), which provides a DC supply signal $V_{DC}$ to the second current mirror 24 and the first current source 28. The first current mirror 22, the second resistive element R2, and the third resistive element R3 are coupled to ground. In another embodiment of the first impedance-compensated amplifier bias circuit 10, the first current mirror 22, the second resistive element R2, and the third resistive element R3 are coupled to a DC reference.

An output OUT of the differential amplifier circuit 26 is coupled to the amplifier bias output ABO and provides the amplifier bias output signal $V_{ABO}$. Additionally, the output OUT of the differential amplifier circuit 26 is coupled to the switched impedance compensation circuit 16 and to the first current mirror 22. The first current mirror 22 has a first mirror current $I_{CM1}$ based on the amplifier bias output signal $V_{ASO}$. A DC bias of the collector current $I_C$ of the amplifier NPN transistor element 20 is based on the amplifier bias output signal $V_{ABO}$, such that the first mirror current $I_{CM1}$ is a mirror of the DC bias of the collector current $I_C$, such that the first mirror current $I_{CM1}$ is about proportional to the DC bias of the collector current $I_C$. The second current mirror 24 provides a second mirror current $I_{CM2}$ to the second resistive element R2 based on the first mirror current $I_{CM1}$, such that the second mirror current $I_{CM2}$ is about proportional to the first mirror current $I_{CM1}$. A first feedback voltage $V_{FB1}$ is developed across the second resistive element R2 and fed to an inverting input INN of the differential amplifier circuit 26. The first feedback voltage $V_{FB1}$ is about proportional to the second mirror current $I_{CM2}$, which is about proportional to the DC bias of the collector current $I_C$. Therefore, the first feedback voltage $V_{FB1}$ is about proportional to the DC bias of the collector current $I_C$.

The first current source 28 has a first control current $I_{CCNT1}$, which is fed to the third resistive element R3. A first control voltage $V_{CNT1}$ is developed across the third resistive element R3 and fed to a non-inverting input INP of the differential amplifier circuit 26. The bias control signal $V_{BIASCT}$ is fed to the first current source 28 to select the appropriate first control current $I_{CNT1}$ and the corresponding first control voltage $V_{CNT1}$, which is associated with selecting the appropriate DC bias to the amplifier 12, depending on which of the first operating mode or the second operating mode is selected. The differential amplifier circuit 26 provides the amplifier bias output signal $V_{ABO}$ based on a difference between the first control voltage $V_{CNT1}$ at the non-inverting input INP and the first feedback voltage $V_{FB1}$ at the inverting input INN. The differential amplifier circuit 26, the first current mirror 22, and the second current mirror 24 form a feedback loop, or control loop, which operates to maintain the first feedback voltage $V_{FB1}$ about equal to the first control voltage $V_{CNT1}$. Therefore, since the first feedback voltage $V_{FB1}$ is about proportional to the DC bias of the collector current $I_C$, the DC bias of the collector current $I_C$ is controlled by the bias control signal $V_{BIASCT}$. The control loop has the control loop bandwidth.

Figure 5:
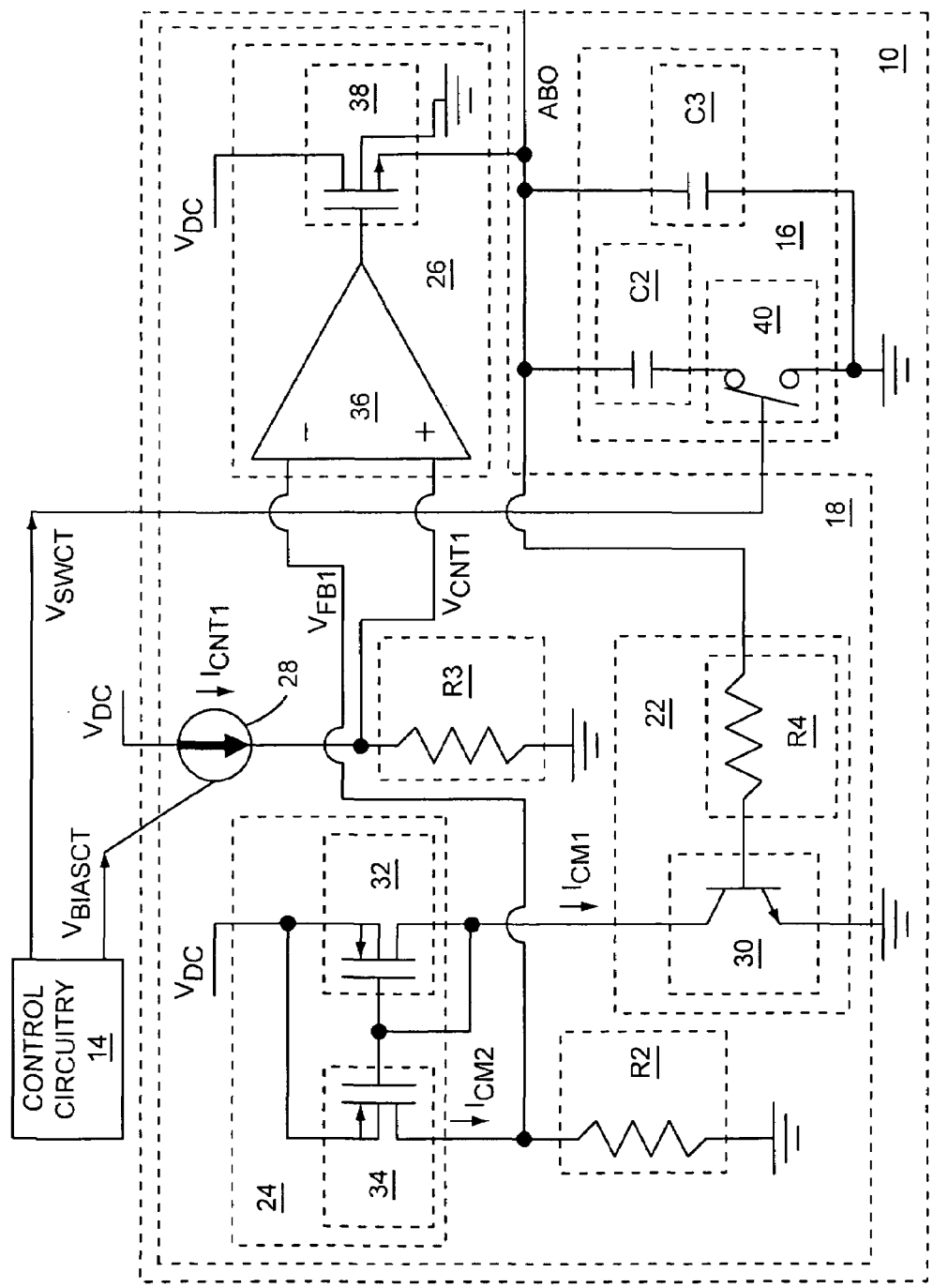
FIG. 5 shows details of a switched impedance compensation circuit, a first current mirror, a second current mirror, and a differential amplifier circuit illustrated in FIG. 4.

FIG. 5 shows details of the switched impedance compensation circuit 16, the first current mirror 22, the second current mirror 24, and the differential amplifier circuit 26 illustrated in FIG. 4. The first current mirror 22 includes a first mirror NPN transistor element 30 and a fourth resistive element R4 coupled between a base of the first mirror NPN transistor element 30 and the amplifier bias output ABO. An emitter of the first mirror NPN transistor element 30 is coupled to ground and the first mirror current $I_{CM1}$ is provided by a collector of the first mirror NPN transistor element 30. Alternate embodiments of the first current mirror 22 may include any number of any type of transistor element, such as a PNP transistor element, an FET element, an N-FET element, a P-FET element, a MOSFET element, an N-MOSFET element, a P-MOSFET element, or any combination thereof.

The second current mirror 24 includes a first mirror P-MOSFET element 32 and a second mirror P-MOSFET element 34. Gates of the first and second mirror P-MOSFET elements 32, 34 and a drain of the first mirror P-MOSFET element 32 are coupled to the collector of the first mirror NPN transistor element 30. A drain of the second mirror P-MOSFET element 34 is coupled to the second resistive element R2 and to the inverting input INN of the differential amplifier circuit 26. Sources and body connections of the first and second mirror P-MOSFET elements 32, 34 are coupled to the DC power supply (not shown), which provides the DC supply signal $V_{DC}$. The first mirror P-MOSFET element 32 receives the first mirror current $I_{CM1}$ and the second mirror P-MOSFET element 34, which has the same gate-to-source voltage as the first mirror P-MOSFET element 32, mirrors the first mirror current $I_{CM1}$ to provide the second mirror current $I_{CM2}$. Alternate embodiments of the second current mirror 24 may include any number of any type of transistor element, such as bipolar transistor elements, NPN transistor elements, PNP transistor elements, FET elements, N-FET elements, P-FET elements, MOSFET elements, N-MOSFET elements, or any combination thereof.

The differential amplifier circuit 26 includes an operational amplifier 36 and a buffer N-MOSFET element 38. An inverting input of the operational amplifier 36 provides the inverting input INN of the differential amplifier circuit 26 and a non-inverting input of the operational amplifier 36 provides the non-inverting input INP of the differential amplifier circuit 26. An output of the operational amplifier 36 is coupled to a gate of the buffer N-MOSFET element 38. A source of the buffer N-MOSFET element 38 provides the output OUT of the differential amplifier circuit 26. A body connection of the buffer N-MOSFET element 38 is coupled to ground and a drain of the buffer N-MOSFET element 38 is coupled to the DC power supply (not shown), which provides the DC supply signal $V_{DC}$. The buffer N-MOSFET element 38 is configured as a source follower and enhances the current drive capability of the operational amplifier 36. Alternate embodiments of the differential amplifier circuit 26 may include any number of any type of transistor element, such a bipolar transistor element, an NPN transistor element, a PNP transistor element, an FET element, an N-FET element, a P-FET element, a MOSFET element, a P-MOSFET element, or any combination thereof.

The switched impedance compensation circuit 16 includes a switching element 40 and a second capacitive element C2 coupled in series between the amplifier bias output ABO and ground. Additionally, the switched impedance compensation circuit 16 includes a third capacitive element C3 coupled in series between the amplifier bias output ABO and ground. The switch control signal $V_{SWCT}$ feeds a control input to the switching element 40. During the first operating mode, the switch control signal $V_{SWCT}$ is in a first state, which causes the switching element 40 to operate in an OPEN state, thereby leaving one end of the second capacitive element C2 uncoupled, such that a capacitance of the third capacitive element C3 is presented by the switched impedance compensation circuit 16. During the second operating mode, the switch control signal $V_{SWCT}$ is in a second state, which causes the switching element 40 to operate in a CLOSED state, thereby coupling the second capacitive element C2 between the amplifier bias output ABO and ground, such that a capacitance of a parallel combination of the second capacitive element C2 and the third capacitive element C3 is presented by the switched impedance compensation circuit 16. In an alternate embodiment of the switched impedance compensation circuit 16, the third capacitive element C3 may be omitted. Additional embodiments of the switched impedance compensation circuit 16 may support any number of operating modes associated with any number of switching elements, any number of switched capacitive elements, any number of fixed capacitive elements, or any combination thereof.

There is an inverse relationship between the control loop bandwidth and the value of the capacitance presented by the switched impedance compensation circuit 16. High values of capacitance provide a low impedance presented to the amplifier 12, which may be necessary to meet amplifier linearity requirements of some wireless communications protocols. However, high values of capacitance may reduce the control loop bandwidth below acceptable limits for certain modulation schemes using some wireless communications protocols. In an exemplary embodiment of the present invention, during the first operating mode, the amplifier 12 is transmitting RF signals using a first wireless communications protocol, and during the second operating mode, the amplifier 12 is transmitting RF signals using a second wireless communications protocol, which has tighter linearity requirements than the first wireless communications protocol, and a modulation scheme that allows a lower control loop bandwidth than the first wireless communications protocol.

During the first operating mode, the switching element 40 is operating in the OPEN state; therefore, only the capacitance of the third capacitive element C3 is presented by the switched impedance compensation circuit 16. The resulting control loop bandwidth allows the amplifier 12 to meet the modulation requirements of the first wireless communications protocol, and the impedance presented to the amplifier 12 allows the amplifier 12 to meet the linearity requirements of the first wireless communications protocol. During the second operating mode, the switching element 40 is operating in the CLOSED state; therefore, the capacitance of the parallel combination of the second and the third capacitive elements C2, C3 is presented by the switched impedance compensation circuit 16. The resulting control loop bandwidth is less than the control loop bandwidth associated with the first operating mode; however, the amplifier 12 still meets the modulation requirements of the second wireless communications protocol. The impedance presented to the amplifier 12 is less than the impedance associated with the first operating mode, which allows the amplifier 12 to meet the linearity requirements of the second wireless communications protocol.

The first impedance-compensated amplifier bias circuit 10 illustrated in FIG. 5 is limited by a trade-off between the control loop bandwidth and the output impedance of the first impedance-compensated amplifier bias circuit 10. In some applications, a required combination of a low output impedance and a wide control loop bandwidth may not be available. Additionally, by converting the second mirror current $I_{CM2}$ and the first control current $I_{CNT1}$ into the first feedback voltage $V_{FB1}$ and the first control voltage $V_{CNT1}$, respectively, the operational amplifier 36 and the buffer N-MOSFET element 38 may require a higher DC supply signal $V_{DC}$ than is available. The current to voltage conversions may present impedance mismatch difficulties and may make frequency stability compensation difficult. Thus, there may be a need for an amplifier bias circuit that can simultaneously provide a low output impedance and a wide control loop bandwidth, that can operate using a low DC supply signal $V_{DC}$, is simple and easy to compensate for frequency stability, or any combination thereof.

Figure 6:
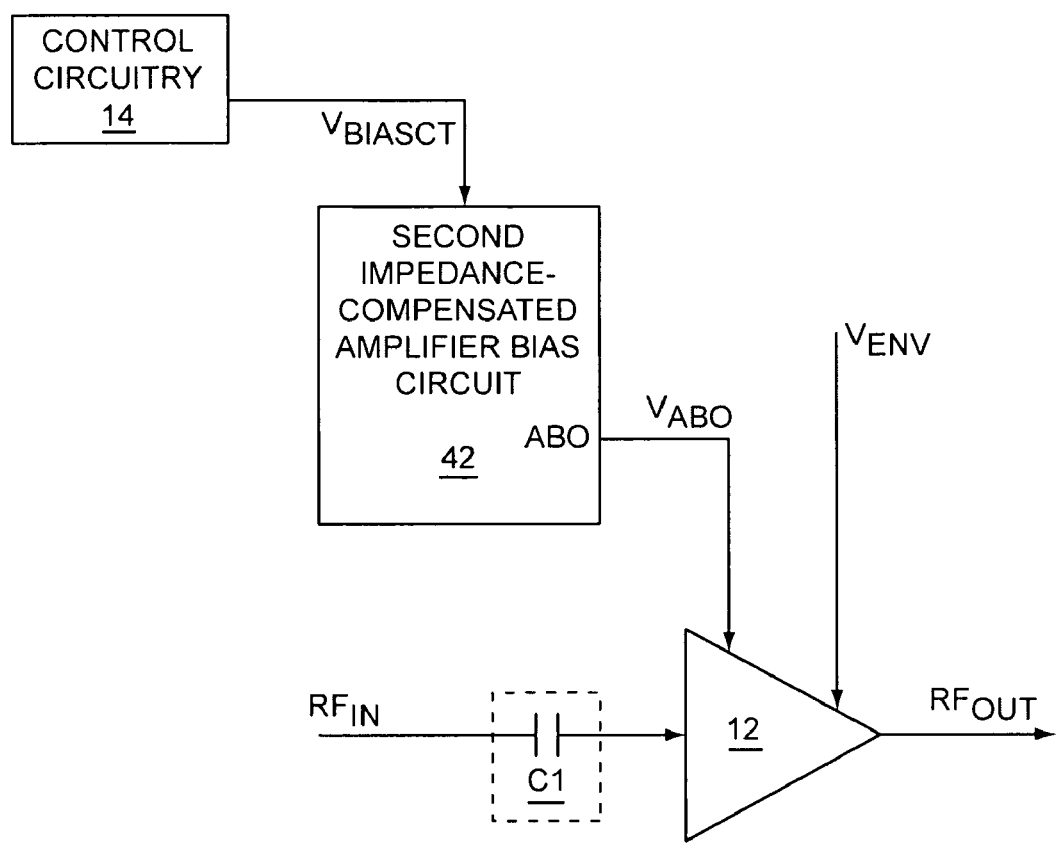
FIG. 6 shows a second impedance-compensated amplifier bias circuit according to another embodiment of the present invention.

FIG. 6 shows a second impedance-compensated amplifier bias circuit 42 according to another embodiment of the present invention. The second impedance-compensated amplifier bias circuit 42 provides the amplifier bias output signal $V_{ABO}$ to the amplifier 12, such as an RF power amplifier, from the amplifier bias output ABO. The RF input signal $RF_{IN}$ feeds the amplifier 12 through the first capacitive element C1, and the amplifier 12 amplifies the RF input signal $RF_{IN}$ to provide the RF output signal $RF_{OUT}$. The first capacitive element C1 AC couples the RF input signal $RF_{IN}$ to the amplifier 12. The amplifier bias output signal $V_{ABO}$ provides the DC bias to the amplifier 12 for proper operation. In one embodiment of the present invention, the envelope power supply (not shown) provides the envelope supply signal $V_{ENV}$ to the amplifier 12. The amplifier 12 and the second impedance-compensated amplifier bias circuit 42 may be used in a multi-mode radio, which may support two or more wireless communications protocols, which may transmit using two or more RF transmit bands.

In one embodiment of the present invention, the control circuitry 14 may select either the first operating mode or the second operating mode. The first and the second operating modes may be associated with the first and the second RF transmit bands, the first and the second wireless communications protocols, or both, respectively. The second impedance-compensated amplifier bias circuit 42 has a control loop, which has a control loop bandwidth. The amplifier bias output ABO of the second impedance-compensated amplifier bias circuit 42 has the output impedance, which may influence linearity of the amplifier 12. The DC bias provided for proper operation may depend upon which of the first operating mode or the second operating mode is selected. In one embodiment of the present invention, during the first operating mode a first value of DC bias is provided and during the second operating mode a second value of DC bias is provided. The control loop bandwidth provided for proper operation may depend upon which of the first operating mode or the second operating mode is selected. In one embodiment of the present invention, during the first operating mode a first value of control loop bandwidth is provided and during the second operating mode a second value of control loop bandwidth is provided. The output impedance presented to the amplifier bias output ABO may depend upon which of the first operating mode or the second operating mode is selected. In one embodiment of the present invention, during the first operating mode a first value of output impedance is presented to the amplifier bias output ABO and during the second operating mode a second value of output impedance is presented to the amplifier bias output ABO.

The control circuitry 14 provides the bias control signal $V_{BIASCT}$ to the second impedance-compensated amplifier bias circuit 42 to select the appropriate DC bias to the amplifier 12 depending on which of the first operating mode or the second operating mode is selected. The control loop bandwidth may depend on the DC bias, the output impedance from the amplifier bias output ABO to the amplifier 12, or both. Alternate embodiments of the present invention may involve selection of one of three or more operating modes, which may be associated with one of three or more values of output impedance from the amplifier bias output ABO, with one of three or more values of DC bias, with one of three or more values of control loop bandwidth, or any combination thereof.

Figure 7:
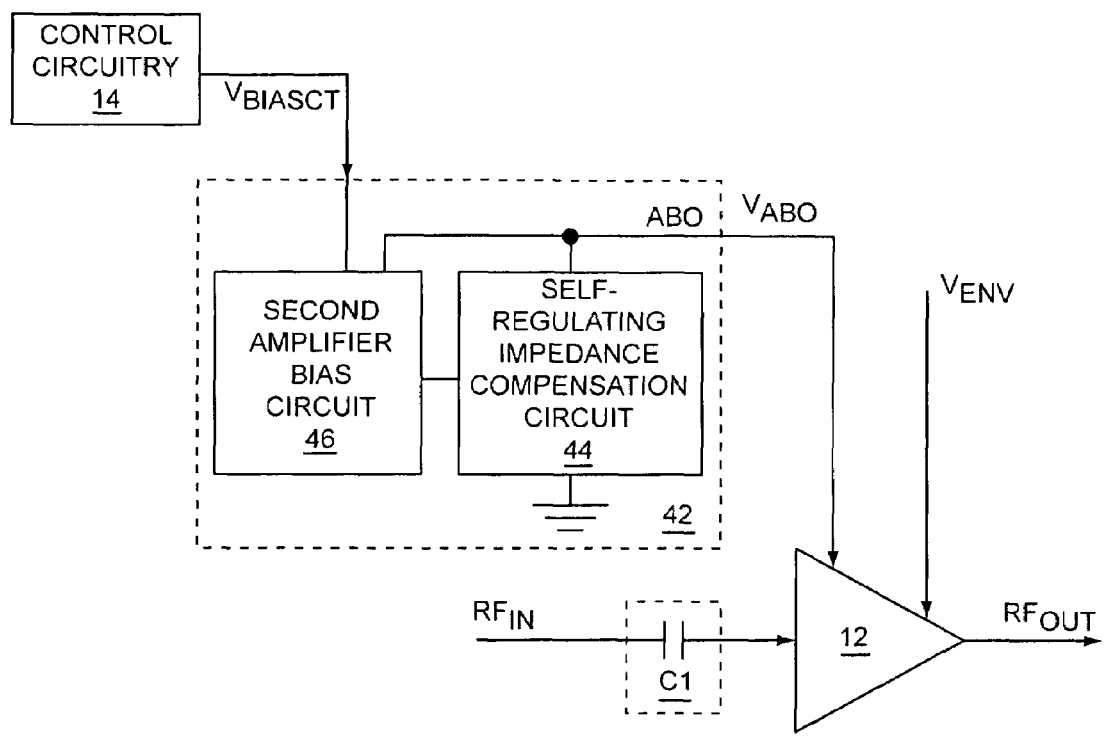
FIG. 7 shows details of the second impedance-compensated amplifier bias circuit illustrated in FIG. 6.

FIG. 7 shows details of the second impedance-compensated amplifier bias circuit 42 illustrated in FIG. 6. The second impedance-compensated amplifier bias circuit 42 includes a self-regulating impedance compensation circuit 44 and a second amplifier bias circuit 46. The control circuitry 14 feeds the bias control signal $V_{BIASCT}$ to the second amplifier bias circuit 46 to select the appropriate DC bias to the amplifier 12 depending on which of the first operating mode or the second operating mode is selected. The second amplifier bias circuit 46 is coupled to the self-regulating impedance compensation circuit 44 to select the appropriate output impedance from the amplifier bias output ABO to the amplifier 12, depending on which of the first operating mode or the second operating mode is selected. The self-regulating impedance compensation circuit 44 is coupled to ground. In another embodiment of the second impedance-compensated amplifier bias circuit 42, the self-regulating impedance compensation circuit 44 is coupled to the DC reference.

Figure 8:
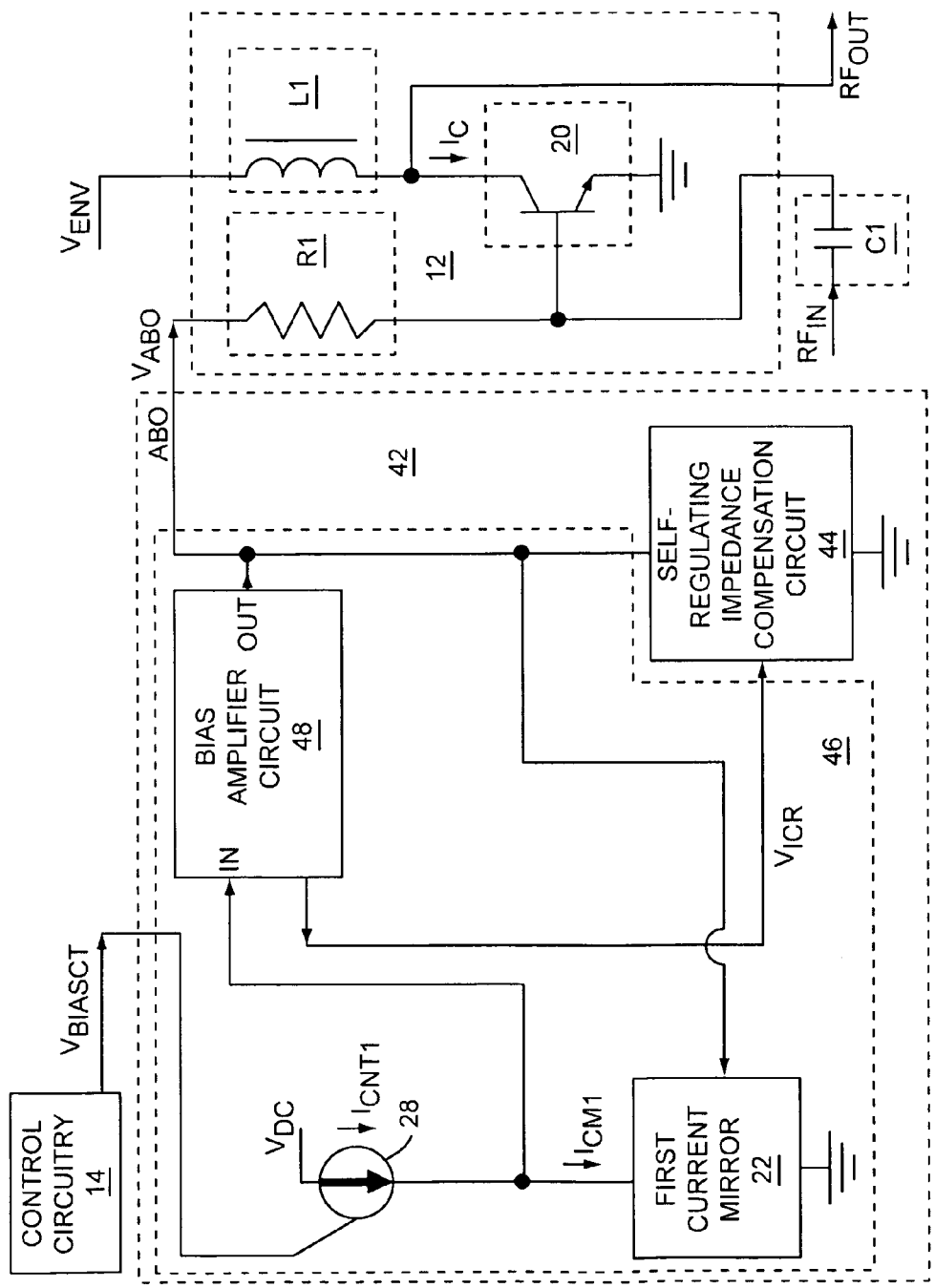
FIG. 8 shows details of a second amplifier bias circuit and an amplifier illustrated in FIG. 7.

FIG. 8 shows details of the second amplifier bias circuit 46 and the amplifier 12 illustrated in FIG. 7. The amplifier 12 includes the amplifier NPN transistor element 20, the first resistive element R1 coupled between the amplifier bias output ABO and the base of the amplifier NPN transistor element 20, and the first inductive element L1 coupled between the envelope power supply (not shown), which provides the envelope supply signal $V_{ENV}$, and the collector of the amplifier NPN transistor element 20. The RF input signal $RF_{IN}$ feeds the base of the amplifier NPN transistor element 20 through the first capacitive element C1, and the collector of the amplifier NPN transistor element 20 provides the RF output signal $RF_{OUT}$. The collector current $I_C$ flows through the collector of the amplifier NPN transistor element 20. The emitter of the amplifier NPN transistor element 20 is coupled to ground. In another embodiment of the amplifier 12, the amplifier NPN transistor element 20 is coupled to the DC reference. Alternate embodiments of the amplifier 12 may include any number of any type of transistor element, such as a PNP transistor element, an FET element, an N-FET element, a P-FET element, a MOSFET element, an N-MOSFET element, a P-MOSFET element, or any combination thereof.

The second amplifier bias circuit 46 includes the first current mirror 22, the first current source 28, and a bias amplifier circuit 48. The first current source 28 is coupled to the DC power supply (not shown), which provides the DC supply signal $V_{DC}$ to the first current source 28. The first current mirror 22 is coupled to ground. In another embodiment of the second impedance-compensated amplifier bias circuit 42, the first current mirror 22 is coupled to a DC reference.

An output OUT of the bias amplifier circuit 48 is coupled to the amplifier bias output ABO and provides the amplifier bias output signal $V_{ABO}$. Additionally, the output OUT of the bias amplifier circuit 48 is coupled to a main input of the self-regulating impedance compensation circuit 44 and to the first current mirror 22. The first current mirror 22 has the first mirror current $I_{CM1}$ based on the amplifier bias output signal $V_{ABO}$. A DC bias of the collector current $I_C$ of the amplifier NPN transistor element 20 is based on the amplifier bias output signal $V_{ABO}$, such that the first mirror current $I_{CM1}$ is a mirror of the DC bias of the collector current $I_C$, such that the first mirror current $I_{CM1}$ is about proportional to the DC bias of the collector current $I_C$.

In FIG. 4, the second current mirror 24 provides the second mirror current $I_{CM2}$ to the second resistive element R2 based on the first mirror current $I_{CM1}$, such that the second mirror current $I_{CM2}$ is about proportional to the first mirror current $I_{CM1}$. The first feedback voltage $V_{FB1}$ is developed across the second resistive element R2 and fed to the inverting input INN of the differential amplifier circuit 26. The first feedback voltage $V_{FB1}$ is about proportional to the second mirror current $I_{CM2}$, which is about proportional to the DC bias of the collector current $I_C$. Therefore, the first feedback voltage $V_{FB1}$ is about proportional to the DC bias of the collector current $I_C$. The first current source 28 has the first control current $I_{CNT1}$, which is fed to the third resistive element R3. The first control voltage $V_{CNT1}$ is developed across the third resistive element R3 and fed to the non-inverting input INP of the differential amplifier circuit 26. In FIG. 8, the second amplifier bias circuit 46 is simplified compared to the first amplifier bias circuit 18 (FIG. 4) by removing the second current mirror 24, the second resistive element R2, and the third resistive element R3, and replacing the differential amplifier circuit 26 with the bias amplifier circuit 48. Instead of converting currents to voltages and amplifying the difference between the voltages, the first current source 28 feeds the first control current $I_{CNT1}$ directly to the first current mirror 22. The bias amplifier circuit 48 senses the junction of the first current source 28 and the first current mirror 22 using an input IN of the bias amplifier circuit 48 and provides the amplifier bias output signal $V_{ABO}$ needed to keep the first mirror current $I_{CM1}$ equal to the first control current $I_{CNT1}$.

The bias control signal $V_{BIASCT}$ is fed to the first current source 28 to select the appropriate first control current $I_{CNT1}$, which is associated with selecting the appropriate DC bias to the amplifier 12, depending on which of the first operating mode or the second operating mode is selected. The bias amplifier circuit 48 and the first current mirror 22 form a feedback loop, or control loop, which operates to keep the first mirror current $I_{CM1}$ equal to the first control current $I_{CNT1}$. Therefore, since the first mirror current $I_{CM1}$ is about proportional to the DC bias of the collector current $I_C$, the DC bias of the collector current $I_C$ is controlled by the bias control signal $V_{BIASCT}$. The control loop has the control loop bandwidth. The bias amplifier circuit 48 provides an impedance compensation regulation signal $V_{ICR}$ to a control input of the self-regulating impedance compensation circuit 44 based on the bias control signal $V_{BIASCT}$. The impedance presented by the self-regulating impedance compensation circuit 44 to the amplifier bias output ABO is based on the impedance compensation regulation signal $V_{ICR}$. A main output of the self-regulating impedance compensation circuit 44 is coupled to ground.

Since the second amplifier bias circuit 46 processes the first mirror current $I_{CM1}$ and the first control current $I_{CNT1}$ directly, the second amplifier bias circuit 46 may operate using a lower DC supply signal $V_{DC}$ than is required by the first amplifier bias circuit 18 illustrated in FIG. 4. In a first exemplary embodiment of the present invention, the second amplifier bias circuit 46 operates using a DC supply voltage of less than or equal to about 1.8 volts. In a second exemplary embodiment of the present invention, the second amplifier bias circuit 46 operates using a DC supply voltage of less than or equal to about 1.5 volts. In a third exemplary embodiment of the present invention, the second amplifier bias circuit 46 operates using a DC supply voltage of less than or equal to about 1.2 volts.

Figure 9:
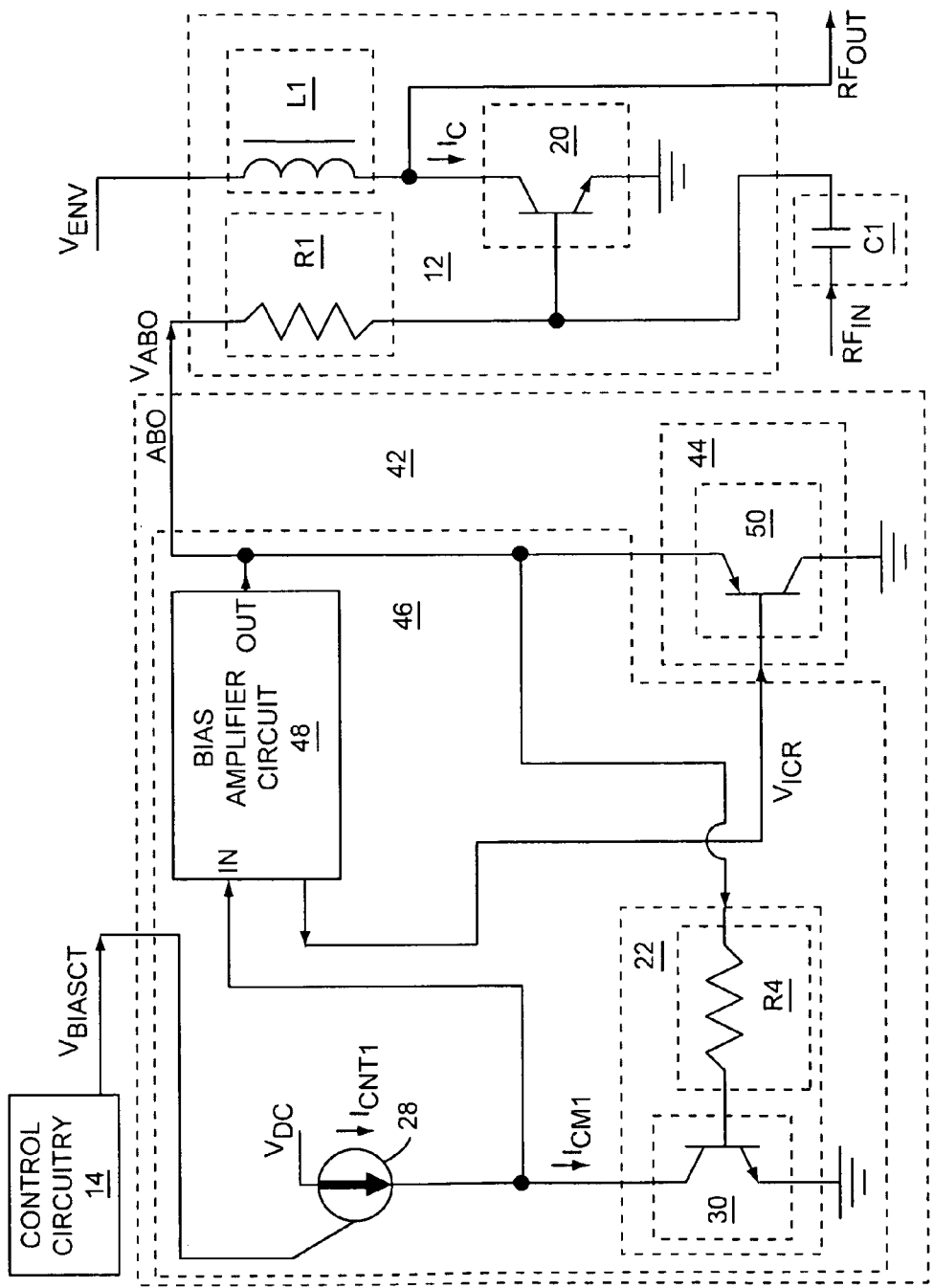
FIG. 9 shows details of the first current mirror and a self-regulating impedance compensation circuit illustrated in FIG. 8 according to one embodiment of the self-regulating impedance compensation circuit.

FIG. 9 shows details of the first current mirror 22 and the self-regulating impedance compensation circuit 44 illustrated in FIG. 8 according to one embodiment of the self-regulating impedance compensation circuit 44. The first current mirror 22 includes the first mirror NPN transistor element 30 and the fourth resistive element R4 coupled between the base of the first mirror NPN transistor element 30 and the amplifier bias output ABO. The emitter of the first mirror NPN transistor element 30 is coupled to ground and the first mirror current $I_{CM1}$ is provided by the collector of the first mirror NPN transistor element 30. Alternate embodiments of the first current mirror 22 may include any number of any type of transistor element, such as a PNP transistor element, an FET element, an N-FET element, a P-FET element, a MOSFET element, an N-MOSFET element, a P-MOSFET element, or any combination thereof. The self-regulating impedance compensation circuit 44 includes a first PNP transistor element 50. An emitter of the first PNP transistor element 50 is coupled to the amplifier bias output ABO, a collector of the first PNP transistor element 50 is coupled to ground, and the impedance compensation regulation signal $V_{ICR}$ feeds a base of the first PNP transistor element 50.

Figure 10:
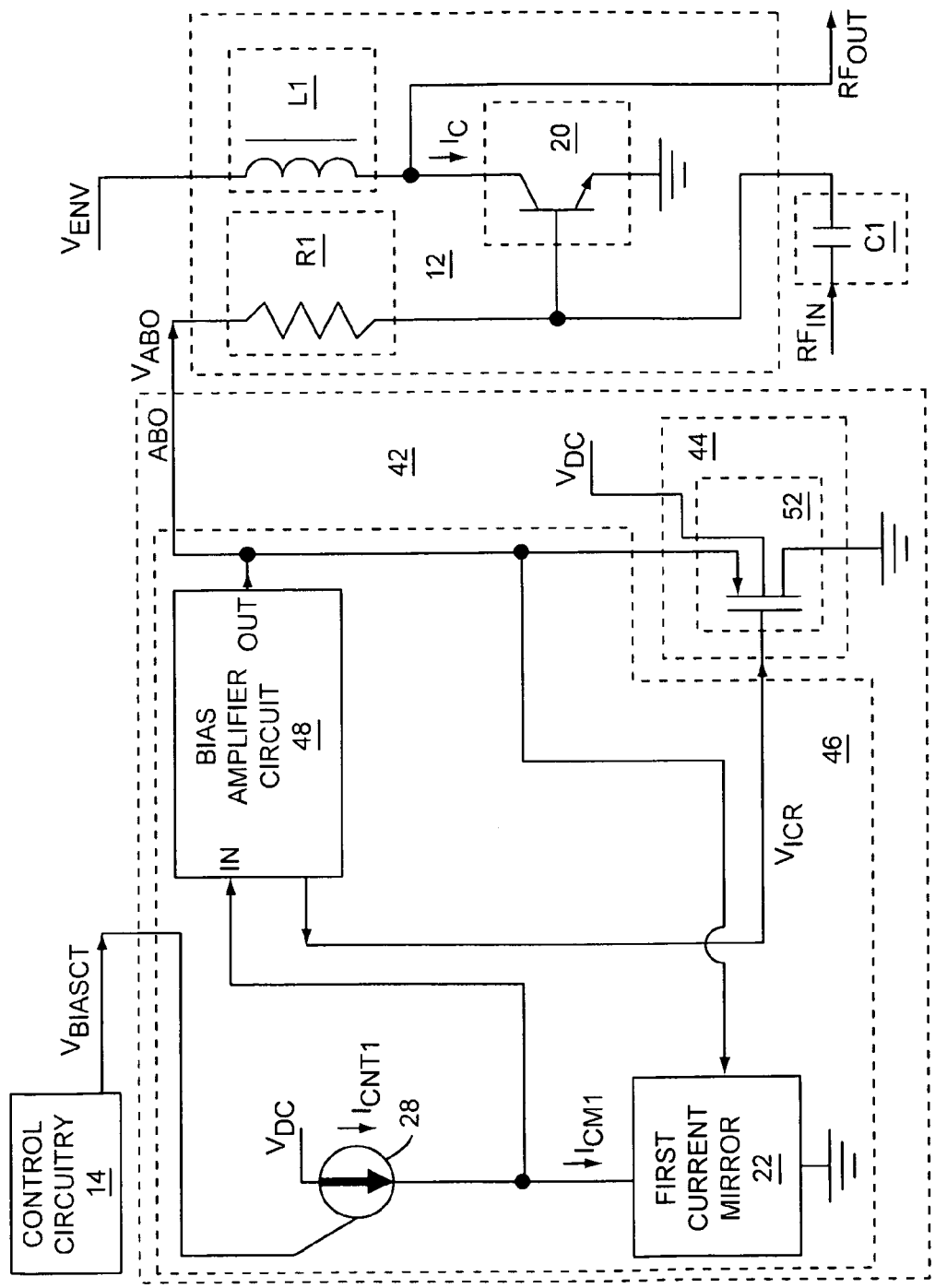
FIG. 10 shows details of the self-regulating impedance compensation circuit illustrated in FIG. 8 according to an alternate embodiment of the self-regulating impedance compensation circuit.

FIG. 10 shows details of the self-regulating impedance compensation circuit 44 illustrated in FIG. 8 according to an alternate embodiment of the self-regulating impedance compensation circuit 44. The self-regulating impedance compensation circuit 44 includes a first P-MOSFET element 52. A source of the first P-MOSFET element 52 is coupled to the amplifier bias output ABO, a drain of the first P-MOSFET element 52 is coupled to ground, the impedance compensation regulation signal $V_{ICR}$ feeds a gate of the first P-MOSFET element 52, and a body connection of the first P-MOSFET element 52 is coupled to the DC power supply (not shown). In an additional embodiment of the self-regulating impedance compensation circuit 44, the first P-MOSFET element 52 is replaced with a P-FET element (not shown).

Figure 11:
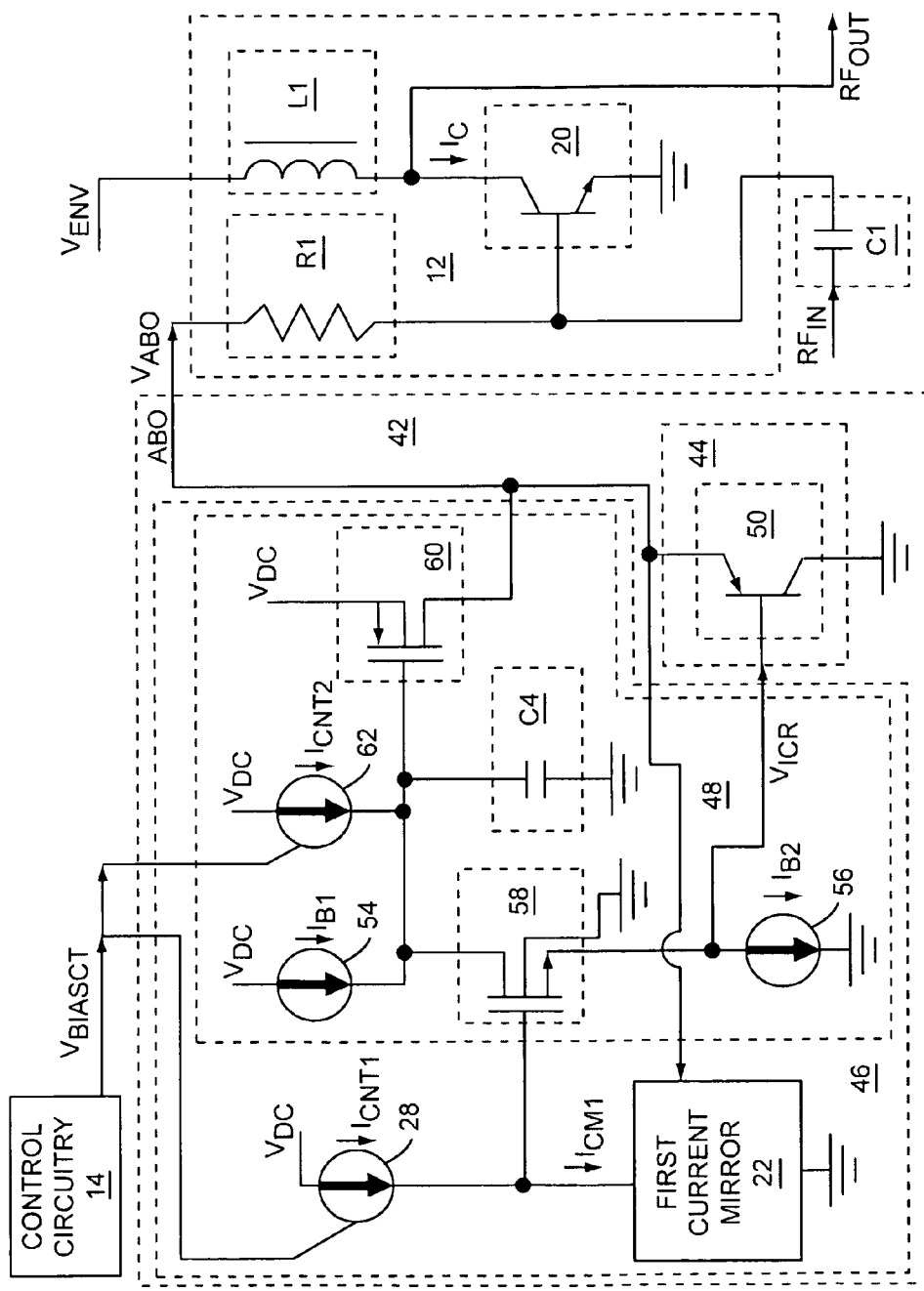
FIG. 11 shows details of a bias amplifier circuit illustrated in FIG. 9 according to one embodiment of the bias amplifier circuit.

FIG. 11 shows details of the bias amplifier circuit 48 illustrated in FIG. 9 according to one embodiment of the bias amplifier circuit 48. The bias amplifier circuit 48 includes a first bias current source 54, which has a first bias current $I_{B1}$, a second bias current source 56, which has a second bias current $I_{B2}$, a first bias N-MOSFET element 58, a first bias P-MOSFET element 60, a second current source 62, which has a second control current $I_{CNT2}$, and a fourth capacitive element C4, which may be used to provide compensation for frequency stability. Alternate embodiments of the bias amplifier circuit 48 may include any number of any type of transistor element, such as an NPN transistor element, a PNP transistor element, an FET element, an N-FET element, a P-FET element, a MOSFET element, an N-MOSFET element, a P-MOSFET element, or any combination thereof in place of, or in addition to, the first bias N-MOSFET element 58, the first bias P-MOSFET element 60, or both.

The first bias current source 54, the second current source 62, and a source and a body connection of the first bias P-MOSFET element 60 are coupled to a DC power supply (not shown), which provides the DC supply signal $V_{DC}$ to the first bias current source 54, the second current source 62, and the first bias P-MOSFET element 60. The second bias current source 56, a body connection of the first bias N-MOSFET element 58, and the fourth capacitive element C4 are coupled to ground. A gate of the first bias N-MOSFET element 58 is coupled to the first current source 28 and to the first current mirror 22. A drain of the first bias N-MOSFET element 58 is coupled to the first bias current source 54, to the second current source 62, to the fourth capacitive element C4, and to a gate of the first bias P-MOSFET element 60. A drain of the first bias P-MOSFET element 60 is coupled to the amplifier bias output ABO and provides the amplifier bias output signal $V_{ABO}$. A source of the first bias N-MOSFET element 58 is coupled to the second bias current source 56 and provides the impedance compensation regulation signal $V_{ICR}$.

The bias control signal $V_{BIASCT}$ is fed to both the first current source 28 and the second current source 62 to select the appropriate first control current $I_{CNT1}$ and second control current $I_{CNT2}$, which are associated with selecting the appropriate DC bias to the amplifier 12, depending on which of the first operating mode or the second operating mode is selected. The first bias N-MOSFET element 58, the first bias P-MOSFET element 60, and the first current mirror 22 form the control loop. The first bias N-MOSFET element 58 senses the junction of the first current source 28 and the first current mirror 22 and provides a signal from the drain of the first bias N-MOSFET element 58 to the first bias P-MOSFET element 60, which provides the amplifier bias output signal $V_{ABO}$ needed to keep the first mirror current $I_{CM1}$ equal to the first control current $I_{CNT1}$. Since the gates of the first bias N-MOSFET element 58 and the first bias P-MOSFET element 60 do not conduct current, the second bias current $I_{B2}$ is equal to the sum of the first bias current $I_{B1}$, the second control current $I_{CNT2}$, and the base current from the first PNP transistor element 50. However, since the first and the second bias currents $I_{B1}$, $I_{B2}$ are constant, the sum of the second control current $I_{CNT2}$ and the base current from the first PNP transistor element 50 are constant. Therefore, as the second control current $I_{CNT2}$ increases, the DC bias to the amplifier 12 increases, and the base current from the first PNP transistor element 50 decreases. Similarly, as the second control current $I_{CNT2}$ decreases, the DC bias to the amplifier 12 decreases, and the base current from the first PNP transistor element 50 increases. Therefore, there is an inverse relationship between the DC bias to the amplifier 12 and the base current from the first PNP transistor element 50.

The output impedance from the first bias P-MOSFET element 60 may decrease as the DC bias to the amplifier 12 increases, and the output impedance from the first PNP transistor element 50 may increase as the base current from the first PNP transistor element 50 decreases. Therefore, as the DC bias to the amplifier 12 increases, the output impedance from the first bias P-MOSFET element 60 may decrease, and the impedance from the first PNP transistor element 50 may increase. In an exemplary embodiment of the present invention, the decrease in the output impedance from the first bias P-MOSFET element 60 may be about equal to the increase in impedance from the first PNP transistor element 50. Since these two impedances combine to present the impedance at the amplifier bias output ABO, the impedance at the amplifier bias output ABO may remain about constant with changes in the DC bias to the amplifier 12. Therefore, the impedance compensation is self-regulating and the control loop bandwidth may be about constant with changes in the DC bias to the amplifier 12. In an exemplary embodiment of the present invention, during the first operating mode, the output impedance from the first bias P-MOSFET element 60 has a first impedance value and the impedance from the first PNP transistor element 50 has a second impedance value, and during the second operating mode, the output impedance from the first bias P-MOSFET element 60 has a third impedance value and the impedance from the first PNP transistor element 50 has a fourth impedance value, such that the first impedance value is greater than the third impedance value and the fourth impedance value is less than the second impedance value.

Figure 12:
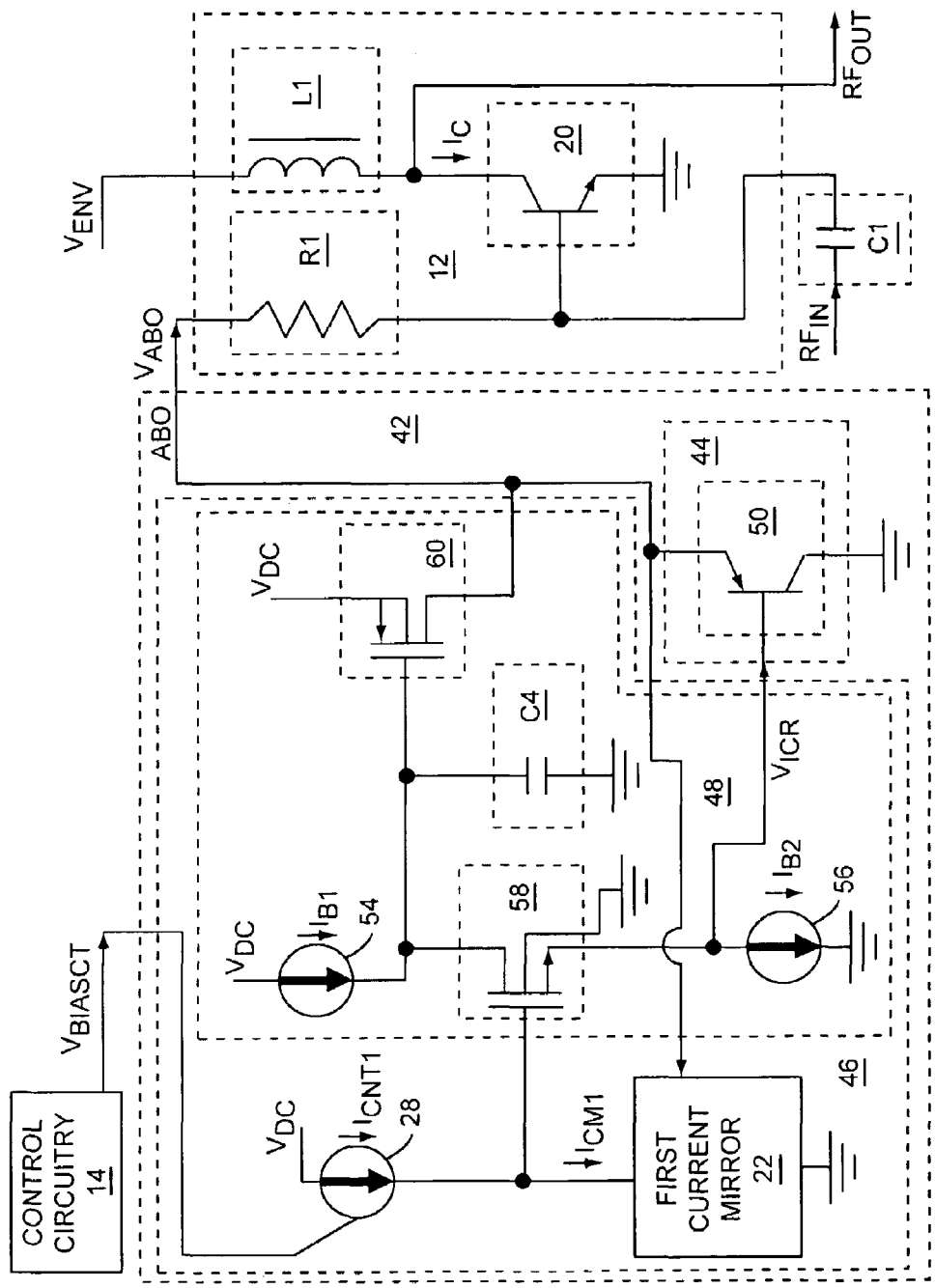
FIG. 12 shows details of the bias amplifier circuit illustrated in FIG. 9 according to an alternate embodiment of the bias amplifier circuit.

FIG. 12 shows details of the bias amplifier circuit 48 illustrated in FIG. 9 according to an alternate embodiment of the bias amplifier circuit 48. The bias amplifier circuit 48 illustrated in FIG. 12 is similar to the bias amplifier circuit 48 illustrated in FIG. 11 except the second current source 62 illustrated in FIG. 11 is omitted in FIG. 12. Omission of the second current source 62 simplifies the bias amplifier circuit 48; however, effectiveness at self-regulating the impedance compensation may be reduced.

In one embodiment of the present invention, the amplifier bias output signal $V_{ABO}$ is based on the bias control signal $V_{BIASCT}$, such that the first operating mode is associated with a first value of the bias control signal $V_{BIASCT}$, and the second operating mode is associated with a second value of the bias control signal $V_{BIASCT}$. In another embodiment of the present invention, the output impedance from the amplifier bias output ABO is varied and the control loop bandwidth is varied based on selection of the first operating mode or the second operating mode, such that the first operating mode is associated with a first impedance value of the output impedance and a first bandwidth value of the control loop bandwidth, and the second operating mode is associated with a second impedance value of the output impedance and a second bandwidth value of the control loop bandwidth. In an exemplary embodiment of the present invention, the first impedance value is less than the second impedance value and the first bandwidth value is less than the second bandwidth value.

Figure 13:
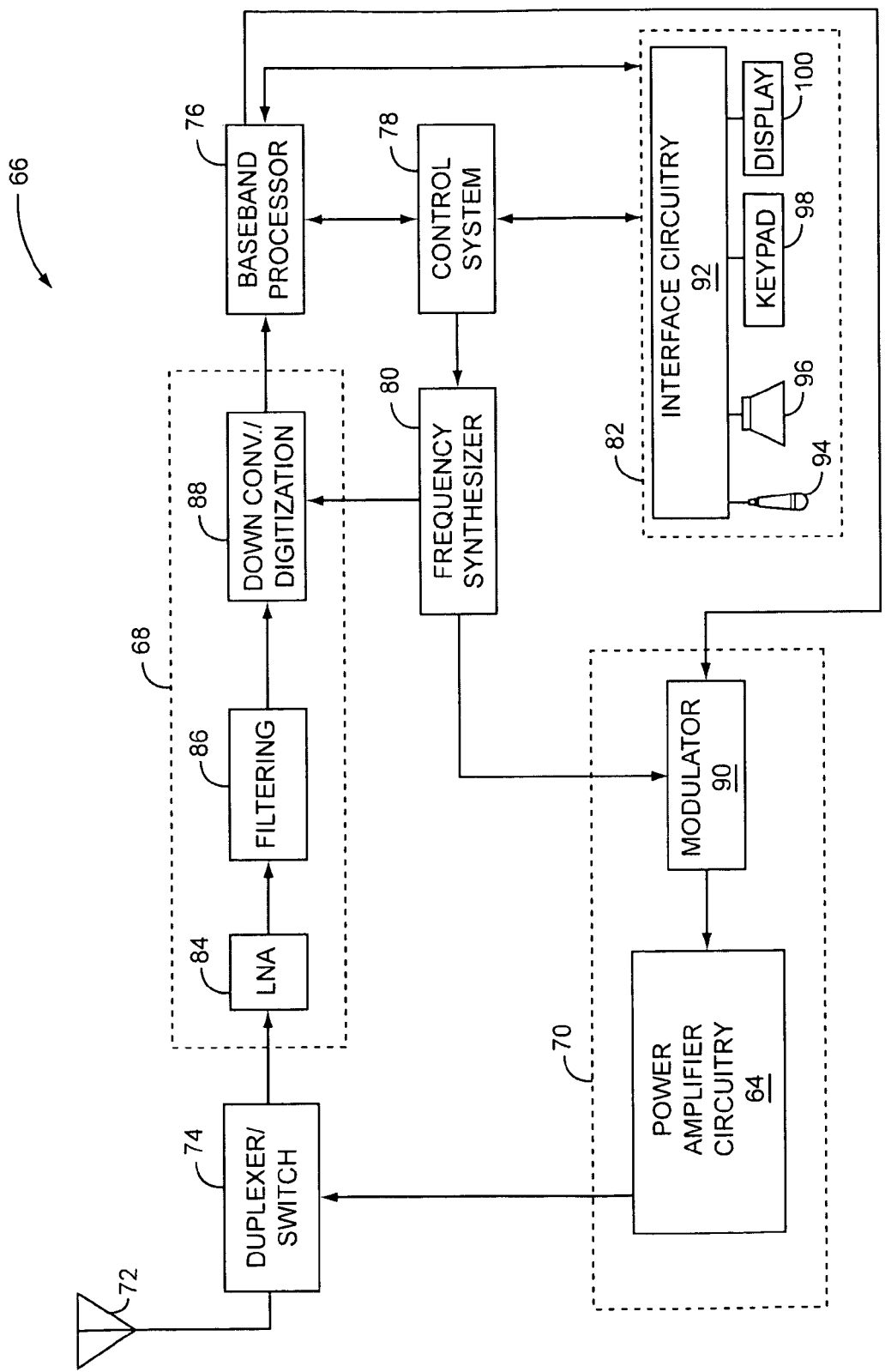
FIG. 13 shows an application example of the present invention used in a mobile terminal.

An application example of an amplifier bias circuit is its use in power amplifier circuitry 64 in a mobile terminal 66, the basic architecture of which is represented in FIG. 13. The mobile terminal 66 may include a receiver front end 68, a radio frequency transmitter section 70, an antenna 72, a duplexer or switch 74, a baseband processor 76, a control system 78, a frequency synthesizer 80, and an interface 82. The receiver front end 68 receives information bearing radio frequency signals from one or more remote transmitters provided by a base station (not shown). A low noise amplifier (LNA) 84 amplifies the signal. Filtering 86 minimizes broadband interference in the received signal, while down conversion and digitization circuitry 88 down converts the filtered, received signal to an intermediate or baseband frequency signal, which is then digitized into one or more digital streams. The receiver front end 68 typically uses one or more mixing frequencies generated by the frequency synthesizer 80. The baseband processor 76 processes the digitized received signal to extract the information or data bits conveyed in the received signal. This processing typically comprises demodulation, decoding, and error correction operations. As such, the baseband processor 76 is generally implemented in one or more digital signal processors (DSPs).

On the transmit side, the baseband processor 76 receives digitized data, which may represent voice, data, or control information, from the control system 78, which it encodes for transmission. The encoded data is output to the transmitter 70, where it is used by a modulator 90 to modulate a carrier signal that is at a desired transmit frequency. The power amplifier circuitry 64 amplifies the modulated carrier signal to a level appropriate for transmission, and delivers the amplified and modulated carrier signal to the antenna 72 through the duplexer or switch 74.

A user may interact with the mobile terminal 66 via the interface 82, which may include interface circuitry 92 associated with a microphone 94, a speaker 96, a keypad 98, and a display 100. The interface circuitry 92 typically includes analog-to-digital converters, digital-to-analog converters, amplifiers, and the like. Additionally, it may include a voice encoder/decoder, in which case it may communicate directly with the baseband processor 76. The microphone 94 will typically convert audio input, such as the user's voice, into an electrical signal, which is then digitized and passed directly or indirectly to the baseband processor 76. Audio information encoded in the received signal is recovered by the baseband processor 76, and converted by the interface circuitry 92 into an analog signal suitable for driving the speaker 96. The keypad 98 and the display 100 enable the user to interact with the mobile terminal 66, input numbers to be dialed, address book information, or the like, as well as monitor call progress information.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

Those skilled in the art will recognize improvements and modifications to the preferred embodiments of the present invention. All such improvements and modifications are considered within the scope of the concepts disclosed herein and the claims that follow.

What is claimed is:

1. Amplifier bias circuitry comprising:
   control circuitry adapted to select one of a first operating mode and a second operating mode;
   a first output having an output impedance and adapted to provide an amplifier bias output signal to a radio frequency (RF) amplifier;
   an RF amplifier bias circuit coupled to the first output and adapted to:
      provide the amplifier bias output signal via the first output; and
      present a first impedance to the first output, such that during the first operating mode the first impedance has a first value and during the second operating mode the first impedance has a second value; and
   an impedance compensation circuit coupled to the first output and adapted to present a second impedance to the first output, such that during the first operating mode the second impedance has a third value and during the second operating mode the second impedance has a fourth value,
   wherein the first impedance and the second impedance combine to provide the output impedance.

2. The amplifier bias circuitry of claim 1 wherein the control circuitry is further adapted to select one of at least three operating modes, the first impedance has a corresponding one of a plurality of values based on the selection of the one of the at least three operating modes, and the second impedance has a corresponding one of a plurality of values based on the selection of the one of the at least three operating modes.

3. The amplifier bias circuitry of claim 1 wherein the RF amplifier bias circuit is further adapted to vary the amplifier bias output signal based on the selection of the one of the first operating mode and the second operating mode, such that the first operating mode is associated with a first bias value of the amplifier bias output signal and the second operating mode is associated with a second bias value of the amplifier bias output signal.

4. The amplifier bias circuitry of claim 3 wherein the first operating mode is associated with the RF amplifier transmitting using a first RF transmit band and the second operating mode is associated with the RF amplifier transmitting using a second RF transmit band.

5. The amplifier bias circuitry of claim 3 wherein the first operating mode is associated with the RF amplifier transmitting using a first wireless communications protocol and the second operating mode is associated with the RF amplifier transmitting using a second wireless communications protocol.

6. The amplifier bias circuitry of claim 3 wherein the first operating mode is associated with the RF amplifier transmitting using a first wireless communications protocol and a first RF transmit band and the second operating mode is associated with the RF amplifier transmitting using a second wireless communications protocol and a second RF transmit band.

7. The amplifier bias circuitry of claim 3 wherein the control circuitry is further adapted to provide an amplifier bias control signal to the RF amplifier bias circuit, such that the amplifier bias output signal is based on the amplifier bias control signal and the first operating mode is associated with a first control value of the amplifier bias control signal and the second operating mode is associated with a second control value of the amplifier bias control signal.

8. The amplifier bias circuitry of claim 7 wherein:
the RF amplifier bias circuit is further adapted to:
  receive the amplifier bias control signal;
  present the first impedance to the first output based on the amplifier bias control signal;
  provide the amplifier bias output signal to the first output based on the amplifier bias control signal; and
  provide an impedance compensation regulation signal based on the amplifier bias control signal; and
the second impedance is based on the impedance compensation regulation signal.

9. The amplifier bias circuitry of claim 8 wherein the first value is greater than the second value and the third value is less than the fourth value.

10. The amplifier bias circuitry of claim 8 wherein the impedance compensation circuit comprises a transistor element having:
  a control input adapted to receive the impedance compensation regulation signal;
  a main input coupled to the first output; and
  a main output coupled to a direct current (DC) reference.

11. The amplifier bias circuitry of claim 10 wherein the transistor element comprises a PNP transistor element and the control input is a base of the PNP transistor element, the main input is an emitter of the PNP transistor element, and the main output is a collector of the PNP transistor element.

12. The amplifier bias circuitry of claim 10 wherein the transistor element comprises a P-type metal-oxide-semiconductor field effect transistor (P-MOSFET) element and the control input is a gate of the P-MOSFET element, the main input is a source of the P-MOSFET element, and the main output is a drain of the P-MOSFET element.

13. The amplifier bias circuitry of claim 10 wherein the DC reference is about ground.

14. The amplifier bias circuitry of claim 8 wherein the RF amplifier bias circuit comprises:
  a first bias amplifier circuit adapted to:
    receive a first control signal based on a first mirror current and a first control current;
    present the first impedance to the first output based on the first control signal;
    provide the amplifier bias output signal to the first output and to a first current mirror based on the first control signal, such that the first mirror current is about equal to the first control current; and
    provide the impedance compensation regulation signal based on the first control signal;
  a first current source adapted to:
    receive the amplifier bias control signal; and
    provide the first control current based on the amplifier bias control signal; and
  the first current mirror adapted to:
    receive the amplifier bias output signal; and
    provide the first mirror current based on the amplifier bias output signal.

15. The amplifier bias circuitry of claim 14 wherein the RF amplifier has an amplifying transistor element having a bias current and the first mirror current is about a mirror of the bias current.

16. The amplifier bias circuitry of claim 15 wherein the bias current is a collector current of the amplifying transistor element.

17. The amplifier bias circuitry of claim 7 wherein the RF amplifier bias circuit is powered from a direct current (DC) power supply having a DC voltage less than or equal to about 1.5 volts.

18. The amplifier bias circuitry of claim 1 wherein the RF amplifier bias circuit has a control loop bandwidth and is further adapted to vary the output impedance and the control loop bandwidth based on the selection of the one of the first operating mode and the second operating mode, such that the first operating mode is associated with a first impedance value of the output impedance and a first bandwidth value of the control loop bandwidth, and the second operating mode is associated with a second impedance value of the output impedance and a second bandwidth value of the control loop bandwidth.

19. The amplifier bias circuitry of claim 18 wherein the first impedance value is less than the second impedance value and the first bandwidth value is less than the second bandwidth value.

20. The amplifier bias circuitry of claim 18 wherein the control circuitry is further adapted to provide an impedance control signal, such that the output impedance is based on the impedance control signal and the first operating mode is associated with a first value of the impedance control signal and the second operating mode is associated with a second value of the impedance control signal.

21. The amplifier bias circuitry of claim 20 wherein the impedance compensation circuit comprises switching circuitry adapted to:
  receive the impedance control signal;
  during the first operating mode, operate in an OPEN state; and
  during the second operating mode, operate in a CLOSED state.

22. The amplifier bias circuitry of claim 1 wherein the amplifier bias output signal is a direct current (DC) bias signal.

23. A method comprising:
  selecting one of a first operating mode and a second operating mode;
  providing a first output having an output impedance;
  providing an amplifier bias output signal to a radio frequency (RF) amplifier;
  coupling an RF amplifier bias circuit to the first output;
  providing the amplifier bias output signal via the first output;
  presenting a first impedance to the first output, such that during the first operating mode the first impedance has a first value and during the second operating mode the first impedance has a second value;
  coupling an impedance compensation circuit to the first output; and
  presenting a second impedance to the first output, such that during the first operating mode the second impedance has a third value and during the second operating mode the second impedance has a fourth value,
wherein the first impedance and the second impedance combine to provide the output impedance.

24. The method of claim 23 wherein the amplifier bias output signal is a direct current (DC) bias signal.

* * * * *